(12) United States Patent
Kim et al.

(10) Patent No.: US 10,971,496 B2
(45) Date of Patent: Apr. 6, 2021

(54) SEMICONDUCTOR DEVICE HAVING HYBRID CAPACITORS

(71) Applicant: SAMSUNG ELECTRONICS CO., LTD., Suwon-si (KR)

(72) Inventors: Sung Hwan Kim, Hwaseong-si (KR); Ji Young Kim, Hwaseong-si (KR); Bong Soo Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/409,046

(22) Filed: May 10, 2019

(65) Prior Publication Data
US 2020/0144269 A1    May 7, 2020

(30) Foreign Application Priority Data

Nov. 2, 2018  (KR) ........................ 10-2018-0133649

(51) Int. Cl.
*H01L 27/08*    (2006.01)
*H01L 27/02*    (2006.01)
*H01L 27/108*   (2006.01)
*H01L 49/02*    (2006.01)

(52) U.S. Cl.
CPC .... *H01L 27/10805* (2013.01); *H01L 27/1085* (2013.01); *H01L 28/82* (2013.01)

(58) Field of Classification Search
CPC ............... H01L 29/41; H01L 21/32139; H01L 27/10852; H01L 27/108; H01L 21/02164; H01L 27/10808; H01L 27/10823; H01L 27/112; H01L 28/90; H01L 21/28525; H01L 27/10888; H01L 27/10885; H01L 27/10891; H01L 21/31111; H01L 21/28568
See application file for complete search history.

(56) References Cited

U.S. PATENT DOCUMENTS

| 6,137,128 A  | 10/2000 | Holmes et al. |
| 8,723,244 B2 | 5/2014  | Miyajima |
| 9,142,558 B2 | 9/2015  | Yang et al. |
| 9,349,724 B2 | 5/2016  | Kim et al. |

(Continued)

FOREIGN PATENT DOCUMENTS

KR    10-1096450    12/2011

*Primary Examiner* — Brian Turner
(74) *Attorney, Agent, or Firm* — F. Chau & Associates, LLC

(57) ABSTRACT

A semiconductor device includes a plurality of lower electrode structures disposed on a substrate, and a supporter pattern disposed between pairs of lower electrode structures of the plurality of lower electrode structures. The semiconductor device further includes a capacitor dielectric layer disposed on surfaces of each of the plurality of lower electrode structures and the supporter pattern, and an upper electrode disposed on the capacitor dielectric layer. The plurality of lower electrode structures includes a first lower electrode and a second lower electrode disposed on the first lower electrode and having a cylindrical shape. The first lower electrode has a pillar shape. The first lower electrode includes an insulating core. The insulating core is disposed in the first lower electrode. An outer side surface of the first lower electrode and an outer side surface of the second lower electrode are coplanar.

15 Claims, 11 Drawing Sheets

(56) References Cited

U.S. PATENT DOCUMENTS

| | | | |
|---|---|---|---|
| 9,935,110 B2 | 4/2018 | Rhie | |
| 2002/0028553 A1* | 3/2002 | Yokoyama | H01L 27/10852 |
| | | | 438/253 |
| 2004/0085708 A1* | 5/2004 | Oh | H01L 28/91 |
| | | | 361/306.3 |
| 2009/0146256 A1* | 6/2009 | Eto | H01L 28/91 |
| | | | 257/532 |
| 2009/0268370 A1* | 10/2009 | Kim | H01G 4/228 |
| | | | 361/303 |
| 2010/0078697 A1 | 4/2010 | Sugino | |
| 2011/0117718 A1* | 5/2011 | Nakamura | H01L 27/10852 |
| | | | 438/387 |
| 2012/0098092 A1* | 4/2012 | Park | H01L 23/5222 |
| | | | 257/532 |
| 2012/0193761 A1* | 8/2012 | Park | H01L 27/10852 |
| | | | 257/532 |
| 2016/0365409 A1* | 12/2016 | Lee | H01L 28/90 |

* cited by examiner

SEMICONDUCTOR DEVICE HAVING HYBRID CAPACITORS

CROSS-REFERENCE TO RELATED APPLICATION

This application claims priority under 35 U.S.C. § 119 to Korean Patent Application No. 10-2018-0133649, filed on Nov. 2, 2018, the disclosure of which is incorporated by reference herein in its entirety.

1. TECHNICAL FIELD

Exemplary embodiments of the present inventive concept relate to a semiconductor device, and more particularly, to a semiconductor device having hybrid capacitors.

2. DISCUSSION OF THE RELATED ART

Currently, since compact and highly integrated semiconductor devices are being developed, miniaturization of capacitors of semiconductor devices is under development. For example, various structures have been attempted to increase an effective surface area of a lower electrode of a capacitor. For example, a structure of a one cylinder stack (OCS) or a hybrid structure in which an OCS and a pillar stack are combined has been proposed. However, in a pillar stack, a conductive material might not be fully filled and a seam may be generated therein.

SUMMARY

According to an exemplary embodiment of the present inventive concept, a semiconductor device includes: a plurality of lower electrode structures disposed on a substrate; a supporter pattern disposed between pairs of lower electrode structures of the plurality of lower electrode structures; a capacitor dielectric layer disposed on surfaces of each of the plurality of lower electrode structures and the supporter pattern; and an upper electrode disposed on the capacitor dielectric layer. The plurality of lower electrode structures includes a first lower electrode and a second lower electrode disposed on the first lower electrode and having a cylindrical shape. The first lower electrode has a pillar shape. The first lower electrode includes an insulating core. The insulating core is disposed in the first lower electrode, and an outer side surface of the first lower electrode and an outer side surface of the second lower electrode are coplanar.

According to an exemplary embodiment of the present inventive concept, a semiconductor device includes; a plurality of lower electrode structures disposed on a substrate; a first supporter pattern disposed between pairs of lower electrode structures of the plurality of lower electrode structures; a second supporter pattern spaced apart from the first supporter pattern; a capacitor dielectric layer disposed on surfaces of each of the plurality of lower electrode structures and the first and second supporter patterns; and an upper electrode disposed on the capacitor dielectric layer, Each of the plurality of lower electrode structures includes a first lower electrode and a second lower electrode disposed on the first lower electrode. The first lower electrode includes an insulating core. The insulating core is disposed in the first lower electrode, and a side surface of the first supporter pattern and a side surface of the second supporter pattern are coplanar.

According to an exemplary embodiment of the present inventive concept, a semiconductor device includes: a plurality of lower electrode structures disposed on a substrate; a supporter pattern disposed between pairs of lower electrode structures of the plurality of lower electrode structures; a capacitor dielectric layer disposed on surfaces of each of the plurality of lower electrode structures and the supporter pattern; and an upper electrode disposed on the capacitor dielectric layer. The lower electrode structure includes a first lower electrode and a second lower electrode disposed on the first lower electrode. The capacitor dielectric layer includes an embedded portion passing through the second lower electrode and extending to an inside of the first lower electrode, and an outer side surface of the first lower electrode and an outer side surface of the second lower electrode are coplanar.

According to an exemplary embodiment of the present inventive concept, a semiconductor device includes: a substrate; a plurality of lower electrode structures disposed on the substrate, and including a plurality of first lower electrodes and a plurality of second lower electrodes disposed on the first lower electrodes, wherein each of the plurality of first lower electrodes includes an insulating core extending toward a lower surface of each of the plurality of first lower electrodes; a first supporter pattern disposed between the plurality of first lower electrodes; a second supporter pattern disposed between the plurality of second lower electrodes; a capacitor dielectric layer disposed on the plurality of second lower electrodes and the first and second supporter patterns; and an upper electrode disposed on the capacitor dielectric layer.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawing, wherein.

DETAILED DESCRIPTION OF THE EMBODIMENTS

Exemplary embodiments of the present inventive concept will be described more fully hereinafter with reference to the accompanying drawings.

Figure 1:
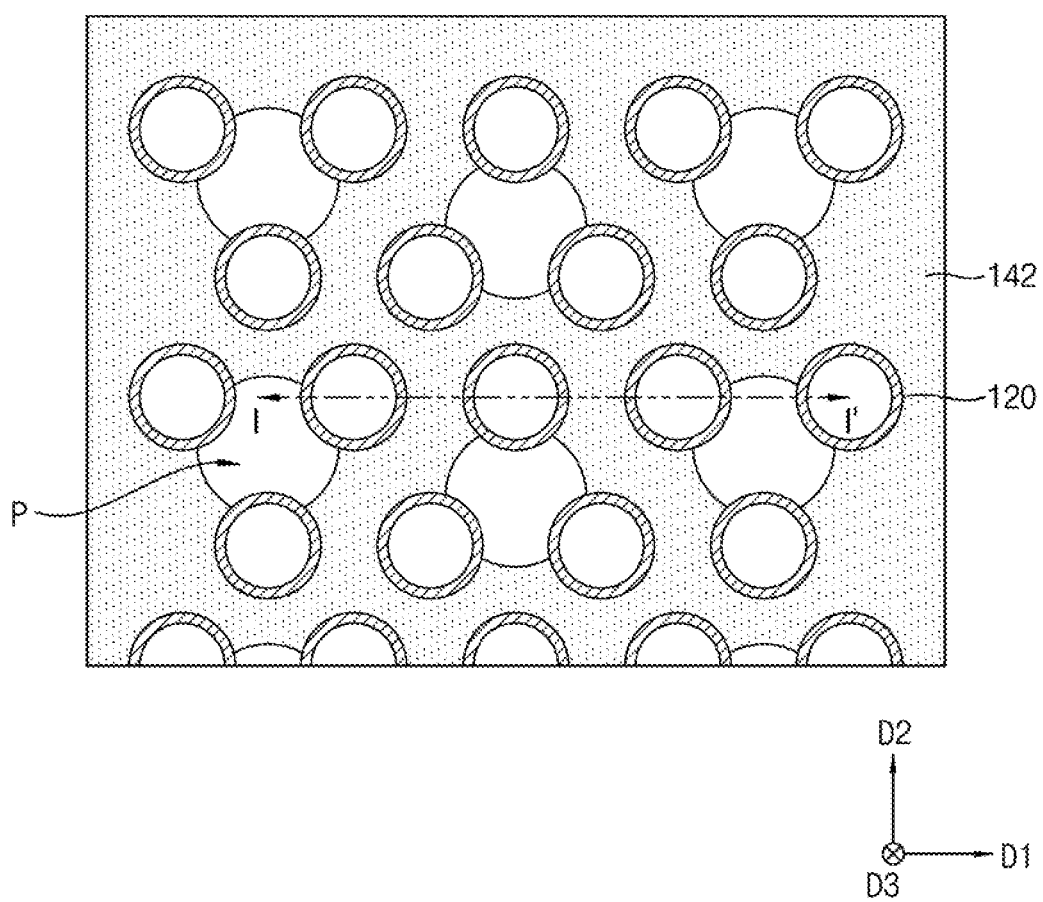
FIG. 1 is a plan view of a semiconductor device according to an exemplary embodiment of the present inventive concept.
Figure 2:
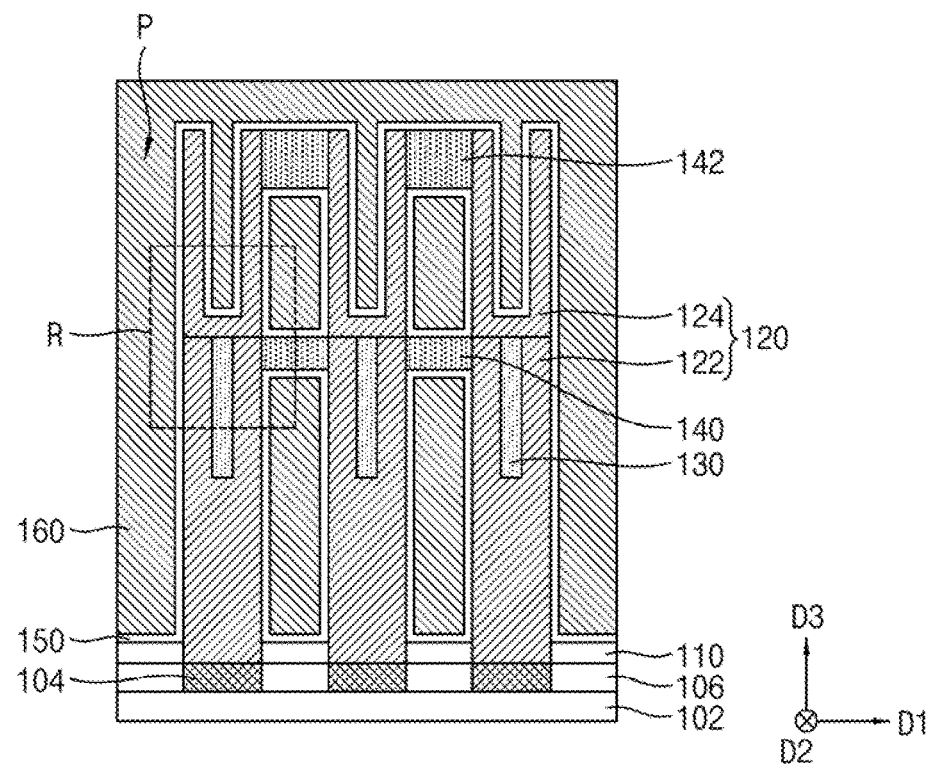
FIG. 2 is a cross-sectional view taken along line I-I' of FIG. 1 according to an exemplary embodiment of the present inventive concept.

FIG. 1 is a plan view of a semiconductor device according to an exemplary embodiment of the present inventive concept. FIG. 2 is a cross-sectional view taken along line I-I' of FIG. 1 according to an exemplary embodiment of the present inventive concept.

Referring to FIGS. 1 and 2, the semiconductor device 100 may include a substrate 102, a contact plug 104, a lower insulating layer 106, an etch stop film 110, lower electrode structures 120, an insulating core 130, a first supporter pattern 140, a second supporter pattern 142, a capacitor dielectric layer 150, and an upper electrode 160.

The substrate 102 may include a semiconductor material. For example, the substrate 102 may be a silicon substrate, a germanium substrate, a silicon germanium substrate, or a silicon-on-insulator (SOI) substrate. A plurality of word lines and bit lines which cross each other may be disposed on the substrate 102, and impurity regions may be disposed on the substrate 102.

The contact plug 104 and the lower insulating layer 106 may be disposed on the substrate 102. The contact plug 104 may be disposed (e.g., buried) in the lower insulating layer 106 and a plurality of contact plugs 104 may be provided. For example, the contact plug 104 may be at least partially surrounded by the insulating layer 106. An upper surface of the contact plug 104 may be positioned at the same level as an upper surface of the lower insulating layer 106. For example, the upper surface of the contact plug 104 and the upper surface of the lower insulating layer 106 may be coplanar. However, the present inventive concept is not limited thereto. In an exemplary embodiment of the present inventive concept, the upper surface of the contact plug 104 may be positioned at a lower level than the upper surface of the lower insulating layer 106. A width of the contact plug 104 may be smaller than or equal to a width of a lower surface of a first lower electrode 122. The contact plug 104 may be electrically connected to the first lower electrode 122. The lower insulating layer 106 may insulate the contact plugs 104 from each other to prevent the plurality of contact plugs 104 from being electrically connected to each other.

The contact plug 104 may include a conductive material. For example, the contact plug 104 may include a doped semiconductor material such as doped polysilicon, a metal-semiconductor compound such as $WSi_2$, a metal nitride such as TiN or TaN, or a metal such as Ti, W, or Ta. The lower insulating layer 106 may include silicon oxide, silicon nitride, silicon oxynitride, or a combination thereof.

The etch stop film 110 may be disposed on the lower insulating layer 106. The etch stop film 110 may prevent a plurality of first lower electrodes 122 from being electrically connected to each other. The etch stop film 110 may include silicon nitride, silicon oxynitride, or a combination thereof. Further, the etch stop film 110 may prevent a wet etchant from flowing to the lower insulating layer 106 during a wet etching process, thereby preventing the lower insulating layer 106 from being etched.

A plurality of lower electrode structures 120 may be disposed on the contact plugs 104. Referring to FIG. 1, the lower electrode structures 120 may be disposed in a honeycomb structure in a plan view when viewed from above. For example, there may be a first row of lower electrode structures 120 extending in a first direction D1 and a second row of lower electrode structures 120 extending in the first direction D1 and adjacent to the first row in a second direction D2 crossing the first direction D1. The lower electrode structures 120 of the second row may be misaligned with the lower electrode structures 120 of the first row in an exemplary embodiment of the present inventive concept, the lower electrode structures 120 may be spaced a predetermined distance from each other in the first direction D1. Further, the lower electrode structures 120 may be arranged in the form of a zigzag in the second direction D2. In an exemplary embodiment of the present inventive concept, the lower electrode structures 120 may be disposed in a lattice pattern or another pattern. One through-hole pattern P may be disposed between, for example, three adjacent lower electrode structures 120 or between six adjacent lower electrode structures 120, and/or may be disposed in another type of pattern of lower electrode structures 120, For example, three lower electrode structures 120 may be disposed around the through-hole, pattern P and may at least partially overlap the through-hole pattern P.

In this specification, the first direction D1 refers to a direction which extends parallel to a main surface of the substrate 102 and in which the lower electrode structures 120 shown in FIG. 2 are arranged. The second direction D2 refers to a direction which is parallel to the main surface of the substrate 102 and is substantially perpendicular to the first direction D1. A third direction D3 refers to a direction substantially perpendicular to the first direction D1 and the second direction D2.

Each lower electrode structure 120 may include the first lower electrode 122 and a second lower electrode 124 disposed on the first lower electrode 122. A lower electrode structure 120 may have a hybrid form including electrodes of different shapes. For example, the first lower electrode 122 may have a pillar shape and the second lower electrode 124 may have a cylindrical shape. The first lower electrode 122 and the second lower electrode 124 might not be misaligned. In other words, the first lower electrode 122 and the second lower electrode 124 may be aligned. For example, an outer side surface of the first lower electrode 122 and an outer side surface of the second lower electrode 124 may be positioned to be coplanar.

The first lower electrode 122 may be disposed on the contact plug 104. The first lower electrode 122 may have a pillar shape and the outer side surface thereof may be covered by the capacitor dielectric layer 150. The first lower electrode 122 may include the insulating core 130 disposed therein. The second lower electrode 124 may be disposed on the first lower electrode 122. The second lower electrode 124 may have a cylindrical shape, and the outer side surface and an inner side surface of the second lower electrode 124 may be covered by the capacitor dielectric layer 150, In FIG. 2, a height of the first lower electrode 122 is shown as being greater than a height of the second lower electrode 124 in the third direction D3, but the present inventive concept is not limited thereto. In an exemplary embodiment of the present inventive concept, the height of the second lower electrode 124 may be greater than the height of the first lower electrode 122.

The first lower electrode 122 and the second lower electrode 124 may be electrically connected to the contact plug 104 and may include a metal, such as Ti, W, Ni, or Co, or a metal nitride, such as TiN, TiSiN, TiAlN, TaN, TaSiN, WN, and/or the like. In an exemplary embodiment of the present inventive concept, the first lower electrode 122 and the second lower electrode 124 may include TiN.

The insulating core 130 may be disposed in an inside of the first lower electrode 122. The insulating core 130 may be positioned at a central portion of the first lower electrode 122 having, for example, a circular shape when viewed from above. However, the present inventive concept is not limited thereto. For example, the insulating core 130 may have a rectangular shape. The insulating core 130 may have a predetermined height, an upper end of the insulating core 130 may be in contact with a lower surface of the second lower electrode 124, and a lower end of the insulating core 130 may be positioned at a higher level than the lower surface of the first lower electrode 122. In FIG. 2, the upper end of the insulating core 130 is shown as being positioned at the same level as an upper surface of the first lower electrode 122, but the present inventive concept is not limited thereto. In an exemplary embodiment of the present inventive concept, the upper end of the insulating core 130 may be positioned at a higher or lower level than the upper surface of the first lower electrode 122. The insulating core 130 may prevent the contact plug 104 from being exposed during an etching process. Further, the insulating core 130 may prevent a decrease in performance of capacitors and/or generation of a leakage current due to a conductive material of the lower electrode structure 120, and prevent degradation of the capacitors. The insulating core 130 may include an insulating material, such as amorphous silicon, an amorphous carbon layer (ACL), or silicon oxide ($SiO_2$).

The first supporter pattern 140 and the second supporter pattern 142 may be disposed between the lower electrode structures 120. The first supporter pattern 140 and the second supporter pattern 142 may connect the lower electrode structures 120 to each other. For example, the first supporter pattern 140 and the second supporter pattern 142 may provide support to the lower electrode structures 120. For example, the first supporter pattern 140 may support the first lower electrodes 122, and the second supporter pattern 142 may support the second lower electrodes 124. A thickness of the second supporter pattern 142 in the third direction D3 may be greater than a thickness of the first supporter pattern 140 in the third direction D3. The first supporter pattern 140 and the second supporter pattern 142 may have the same shape when viewed from above. In an exemplary embodiment of the present inventive concept, a side surface of the first supporter pattern 140, which is in contact with the first lower electrode 122, and a side surface of the second supporter pattern 142, which is in contact with the second lower electrode 124, may be coplanar.

As shown in FIG. 1, the first supporter pattern 140 and the second supporter pattern 142 may have a mesh shape in which through-hole patterns P are formed on a plate in a predetermined pattern. In FIG. 2, two supporter patterns are shown, but the present inventive concept is not limited thereto, and one supporter pattern or three or more supporter patterns may be disposed. For example, the first supporter pattern 140 and the second supporter pattern 142 may include an insulating material and may include, for example, silicon nitride and/or silicon oxynitride.

The capacitor dielectric layer 150 may be disposed between the lower electrode structure 120 and the upper electrode 160. For example, the capacitor dielectric layer 150 may be conformally disposed on surfaces of the etch stop film 110, the lower electrode structure 120, the first supporter pattern 140, and the second supporter pattern 142. For example, the capacitor dielectric layer 150 may include a metal oxide, such as $HfO_2$, $ZrO_2$, $Al_2O_3$, $La_2O_3$, $Ta_2O_3$, or $TiO_2$, a dielectric material having a perovskite structure, such as $SrTiO_3$ (STO), $BaTiO_3$, lead zirconate titanate (PZT), or lanthanum-doped lead zirconate titanate (PLZT), or a combination thereof.

The upper electrode 160 may be disposed on the capacitor dielectric layer 150. For example, the upper electrode 160 may include a metal, such as Ti, W, Ni, or Co, or a metal nitride, such as TiN, TiSiN, TiAlN, TaN, TaSiN, WN, and/or the like. In an exemplary embodiment of the present inventive concept, like the first lower electrode 122 and the second lower electrode 124, the upper electrode 160 may include TiN. The first lower electrode 122, the second lower electrode 124, the capacitor dielectric layer 150, and the upper electrode 160 may function as capacitors.

FIGS. 3, 4, 5, 6, 7, 8, 9 and 10 are cross-sectional views illustrating a method of manufacturing a semiconductor device according to an exemplary embodiment of the present inventive concept.

Figure 3:
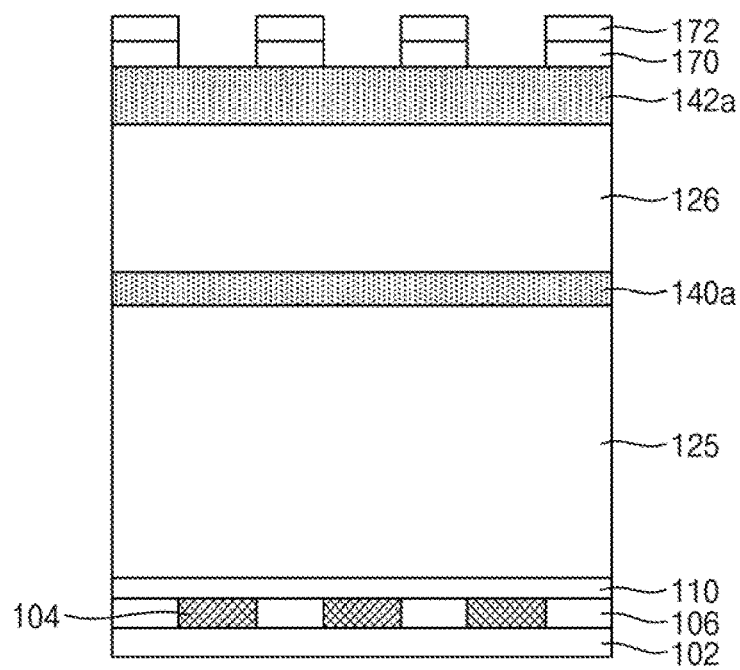
FIGS. 3, 4, 5, 6, 7, 8, 9 and 10 are cross-sectional views illustrating a method of manufacturing a semiconductor device according to an exemplary embodiment of the present inventive concept.

Referring to FIG. 3, a lower insulating layer 106 may be disposed on a substrate 102. In addition, contact plugs 104 are disposed in the lower insulating layer 106. An etch stop film 110, a first mold layer 125, a first supporter layer 140a, a second mold layer 126, a second supporter layer 142a, a first mask pattern 170, and a second mask pattern 172 may be sequentially stacked on the contact plugs 104 and the lower insulating layer 106.

The etch stop film 110 may include a material having an etch selectivity with respect to the first mold layer 125 and the second mold layer 126. For example, the etch stop film 110 may include silicon nitride, silicon oxynitride, or a combination thereof.

The first mold layer 125 and the second mold layer 126 may include a material having an etch selectivity with respect to the first supporter layer 140a and the second supporter layer 142a, For example, the first mold layer 125 and the second mold layer 126 may include silicon oxide. For example, the first supporter layer 140a and the second supporter layer 142a may include silicon nitride. In an exemplary embodiment of the present inventive concept, a thickness of the second supporter layer 142a may be greater than a thickness of the first supporter layer 140a. However, the present inventive concept is not limited thereto.

A portion of the second supporter layer 142a may be exposed by the first mask pattern 170 and the second mask pattern 172, A region in which a lower electrode structure 120 is disposed may be formed by the first mask pattern 170 and the second mask pattern 172. For example, the first mask pattern 170 may include amorphous carbon and/or polysilicon, and the second mask pattern 172 may include a photosensitive material.

Figure 4:
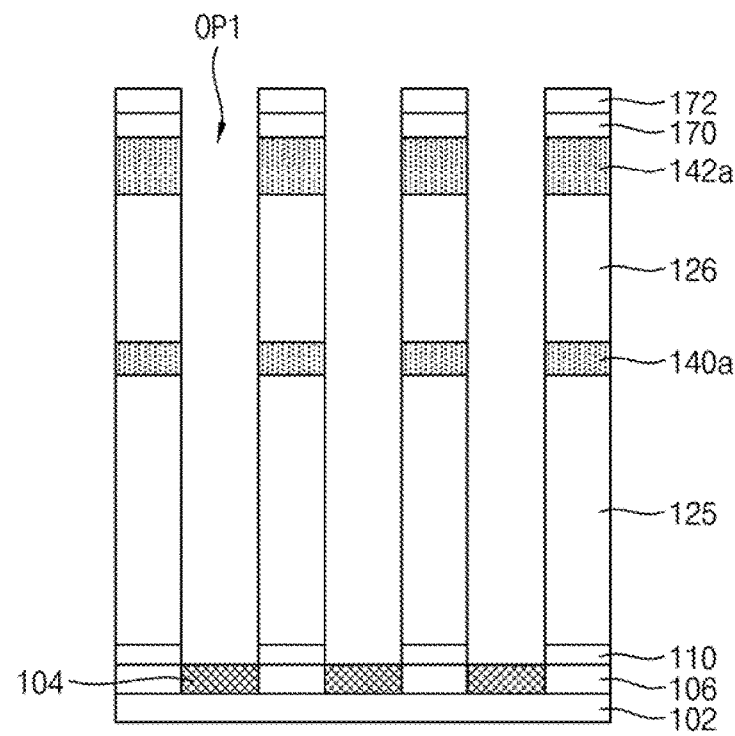

Referring to FIG. 4, openings OP1 may be formed along the first mask pattern 170 and the second mask pattern 172. The openings OP1 may be formed to pass through the etch stop film 110, the first mold layer 125, the first supporter layer 140a, the second mold layer 126, and the second supporter layer 142a. The opening OP1 may have a constant width with respect to the first direction D1. In an exemplary embodiment of the present inventive concept, the opening OP1 may be formed with a tapered shape extending in a downward direction from the second supporter layer 142a toward the substrate 102. In an exemplary embodiment of the present inventive concept, the opening OP1 may be formed using a dry etching process. The second supporter layer 142a, the second mold layer 126, the first supporter layer 140a, and the first mold layer 125 are sequentially anisotropically etched using a dry etching process, and then the etch stop film 110 may be partially removed such that the contact plugs 104 are exposed.

Figure 5:
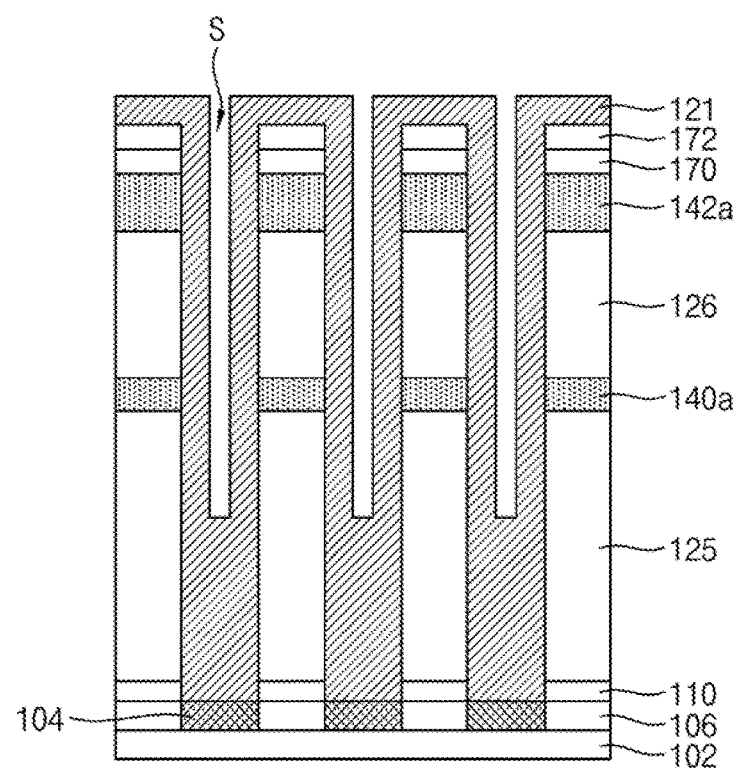

Referring to FIG. 5, a first conductive layer 121 may be deposited in the openings OP1, and may cover side surfaces and lower surfaces of the openings OP1 and an upper surface of the second mask pattern 172. For example, the first conductive layer 121 may be formed by a process such as a chemical vapor deposition (CVD) process, an atomic layer deposition (ALD) process, a plasma-enhanced ALD (PEALD) process, or the like. In an exemplary embodiment of the present inventive concept, the first conductive layer 121 may be deposited by an ALD process. The first conductive layer 121 might not fully fill the openings OH and may include seams S therein. The seam S may be formed to extend from an upper end of the opening OP1 by a predetermined height. A lower end of the seam S may be positioned at a higher level than an upper surface of the contact plug 104. For example, the seam S might not reach the upper surface of the contact plug 104. For example, the first conductive layer 121 may include a metal, such as Ti, W, Ni, or Co, or a metal nitride, such as TiN, TiSiN, TiAlN, TaN, TaSiN, WN, and/or the like.

Figure 6:
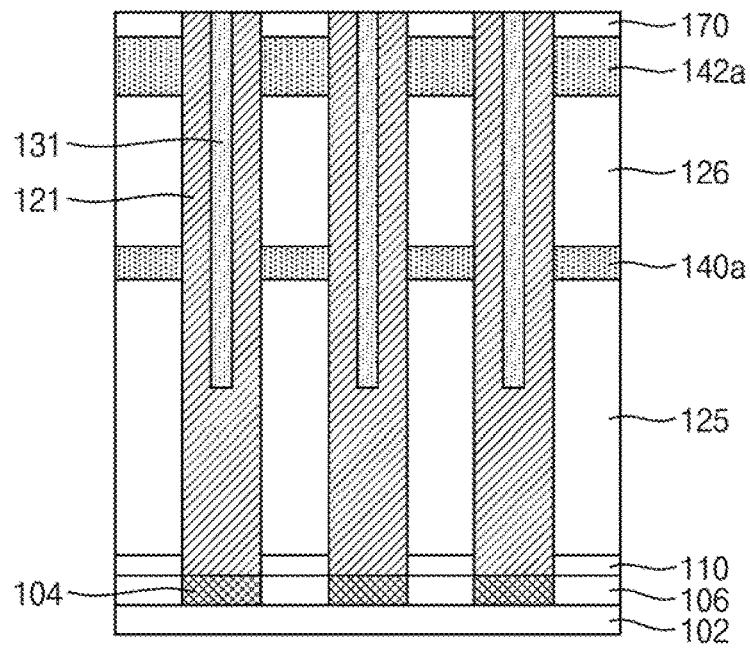

Referring to FIG. 6, an insulating core 131 may be disposed in the seam S. For example, the insulating core 131 may fill the inside of the seam S and may be formed by a process such as a CVD process, an ALD process, or the like. The insulating core 131 may have a constant width with respect to the first direction D1 an exemplary embodiment of the present inventive concept, the insulating core 131 may be formed to have a tapered shape extending in a downward direction.

After the insulating core 131 fills the seam S, a planarization process may be performed. The second mask pattern 172 may be removed by the planarization process. An upper surface of the first conductive layer 121 may be positioned at substantially the same level as an upper end of the insulating core 131. In an exemplary embodiment of the present inventive concept, the planarization process may be omitted. For example, the insulating core 131 may include an insulating material, such as amorphous silicon, an ACL, and/or silicon oxide ($SiO_2$).

Figure 7:
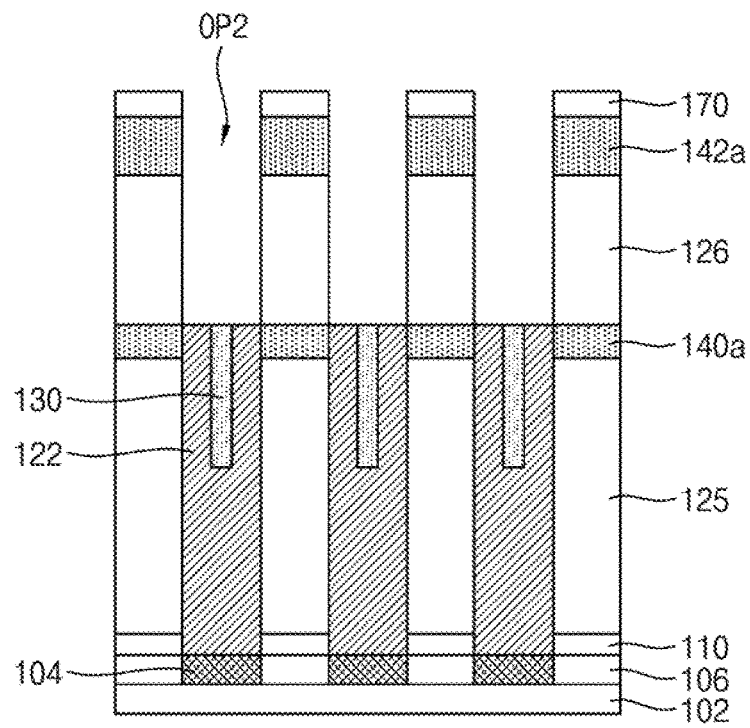

Referring to FIG. 7, the first conductive layer 121 and the insulating core 131 may be partially removed by a recess process so that a first lower electrode 122 and an insulating core 130 may be formed. An opening OP2 may be formed by the removal of the first conductive layer 121 and the insulating core 131, In an exemplary embodiment of the present inventive concept, the opening OP2 may be formed by an etch-back process, Since the insulating core 130 is disposed in the inside of the seam S, a portion of the first conductive layer 121 may be etched during the etch-back process to prevent the contact plug 104 from being exposed. For example, the first conductive layer 121 may etched until the first supporter layer 140a is reached.

In FIG. 7, an upper surface of the first lower electrode 122 and the upper end of the insulating core 130 are shown as being positioned at the same level as an upper surface of the first supporter layer 140a, but the present inventive concept is not limited thereto. In an exemplary embodiment of the present inventive concept, the upper surface of the first lower electrode 122 and/or the upper end of the insulating core 130 may be positioned at a higher or lower level than the upper surface of the first supporter layer 140a.

Figure 8:
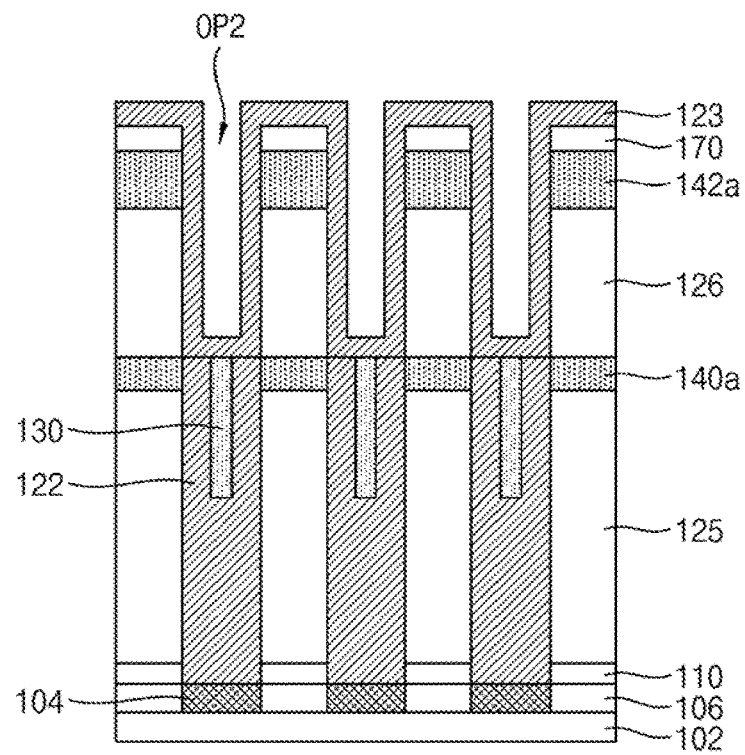

Referring to FIG. 8, a second conductive layer 123 may be deposited in the openings OP2. For example, the second conductive layer 123 may cover side surfaces and lower surfaces of the openings OP2 and an upper surface of the first mask pattern 170. For example, the second conductive layer 123 may be formed by a process such as a CVD process, an ALD process, or the like. The second conductive layer 123 may have a relatively smaller thickness than that of the first lower electrode 122 and/or the first conductive layer 121. The second conductive layer 123 may include the same material as that of the first lower electrode 122. For example, the second conductive layer 12:3 and the first lower electrode 122 may include TIN.

Figure 9:
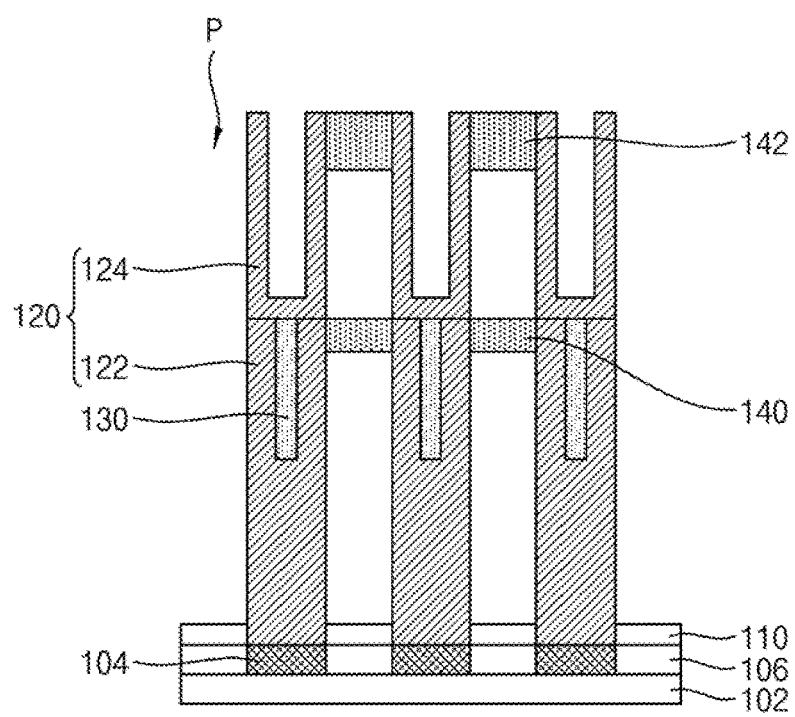

Referring to FIG. 9, the first supporter layer 140a and the second supporter layer 142a may be patterned and the first mold layer 125 and the second mold layer 126 may be removed. A portion of the second supporter layer 142a may be removed first, and second supporter patterns 142 may be formed. For example, the portions of the second supporter layer 142a that are removed may correspond to the through-hole pattern P as shown in FIGS. 1 and 2, A portion of the second mold layer 126 may be exposed by the second supporter patterns 142 and at least the exposed portions of the second mold layer 126 may be removed. For example, the second mold layer 126 may be entirely removed by a wet etching process. For example, a wet etchant may flow between the second supporter patterns 142 to remove the second mold layer 126. During the etching process of the second mold layer 126, the second lower electrode 124, the first supporter layer 140a, and the second supporter layer 142a, which have an etch selectivity with respect to the second mold layer 126, might not be removed. After the second mold layer 126 is entirely removed, the second supporter pattern 142 may connect and support the adjacent second lower electrodes 124 to each other so that the second lower electrodes 124 do not collapse. The first supporter layer 140a which is exposed by removing the second mold layer 126 may be patterned by an anisotropic etching process. The first supporter layer 140a may be partially removed and a first supporter pattern 140 may be formed. For example, the portions of the first supporter layer 140a that are removed may correspond to the through-hole pattern P as shown in FIGS. 1 and 2. A shape of the first supporter pattern 140 may correspond to a shape of the second supporter pattern 142. A portion of the first mold layer 125 may be exposed by the first supporter pattern 140 and at least the exposed portions of the first mold layer 125 may be removed. For example, the first mold layer 125 may be entirely removed by a wet etching process. The etch stop film 110, the first lower electrode 122, the second lower electrode 124, the first supporter pattern 140, and the second supporter pattern 142, which have an etch selectivity with respect to the first mold layer 125, might not be removed. After the first mold layer 125 is entirely removed, the first supporter pattern 140 may connect the first lower electrodes 122 to each other so that the first lower electrodes 122 do not collapse. For example, the first supporter pattern 140 supports the first lower electrodes 122. The second supporter pattern 142 may be partially removed by the above-described etching process and a through-hole pattern P may be formed. In addition, the same through-hole pattern Pas the second supporter pattern 142 may be formed in the first supporter pattern 140.

Figure 10:
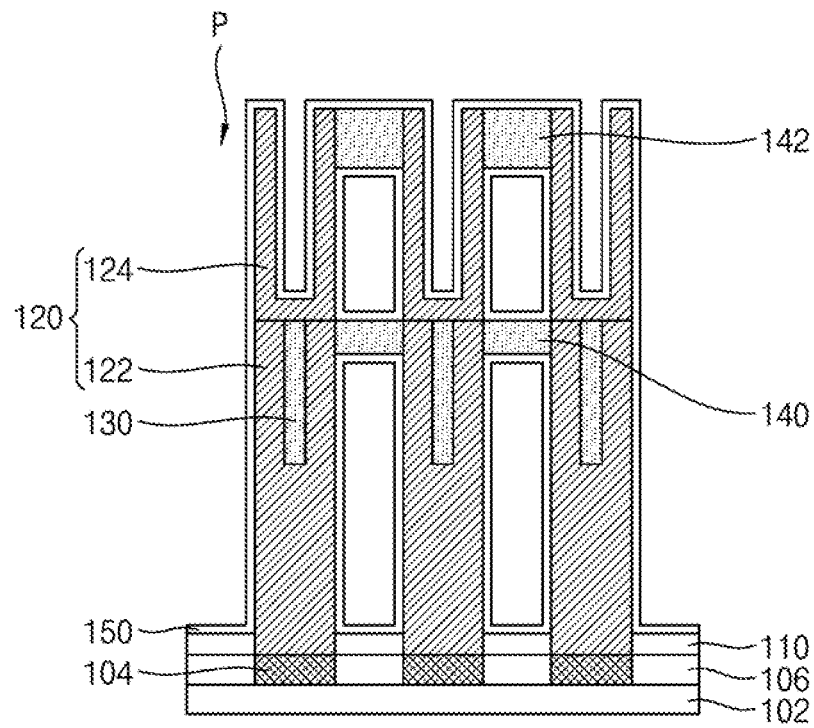

Referring to FIG. 10, a capacitor dielectric layer 150 may be deposited on a surface of the resultant of FIG. 9. For example, the capacitor dielectric layer 150 may be conformally formed along surfaces of the etch stop film 110, the first lower electrode 122, the second lower electrode 124, the first supporter pattern 140, and the second supporter pattern 142.

For example, the capacitor dielectric layer 150 may include a metal oxide, such as $HfO_2$, $ZrO_2$. $Al_2O_3$, $La_2O_3$, $Ta_7O_3$, or $TiO_2$, a dielectric material of a perovskite structure, such as STO, $BaTiO_3$, PZT, or PLZT, or a combination thereof. The capacitor dielectric layer 150 may be formed by a process such as a CVD process, an ALD process, or the like.

Referring to FIG. 2, an upper electrode 160 may be disposed on a surface of the resultant of FIG. 10, For example, the upper electrode 160 may be formed to cover the capacitor dielectric layer 150. The upper electrode 160 may at least partially fill a space between the lower electrode structures 120, an inside of the second lower electrode 124, and a space between the first supporter pattern 140 and the second supporter pattern 142. The lower electrode structure 120, the capacitor dielectric layer 150 and the upper electrode 160 may function as capacitors.

The upper electrode 160 may include the same material as that of the first lower electrode 122 and the second lower electrode 124. For example, the upper electrode 160 may include TiN. The upper electrode 160 may be formed by a process such as a CVD process, an ALD process, or the like.

As shown in FIGS. 4 and 8, since the first lower electrode 122 and the second lower electrode 124 are disposed in the opening OP1 formed by etching the first mold layer 125, the first supporter layer 140a, the second mold layer 126, and the second supporter layer 142a during a single process, the first lower electrode 122 and the second lower electrode 124 may be aligned. For example, an outer side surface of the first lower electrode 122 and an outer side surface of the second lower electrode 124 may be coplanar.

As shown in FIGS. 5 and 6, since the insulating core 130 fills the seam S inside the first conductive layer 121, a portion of the first conductive layer 121 may be etched in a subsequent etching process to prevent the contact plug 104 from being exposed. Further, the insulating core 130 may remain inside the first lower electrode 122 so that leakage current of capacitors may be prevented.

FIGS. 11, 12, 13 and 14 are enlarged partial views of semiconductor devices according to an exemplary embodiment of the present inventive concept. FIGS. 11 to 14 each correspond to a region R of the semiconductor device shown in FIG. 2.

Figure 11:
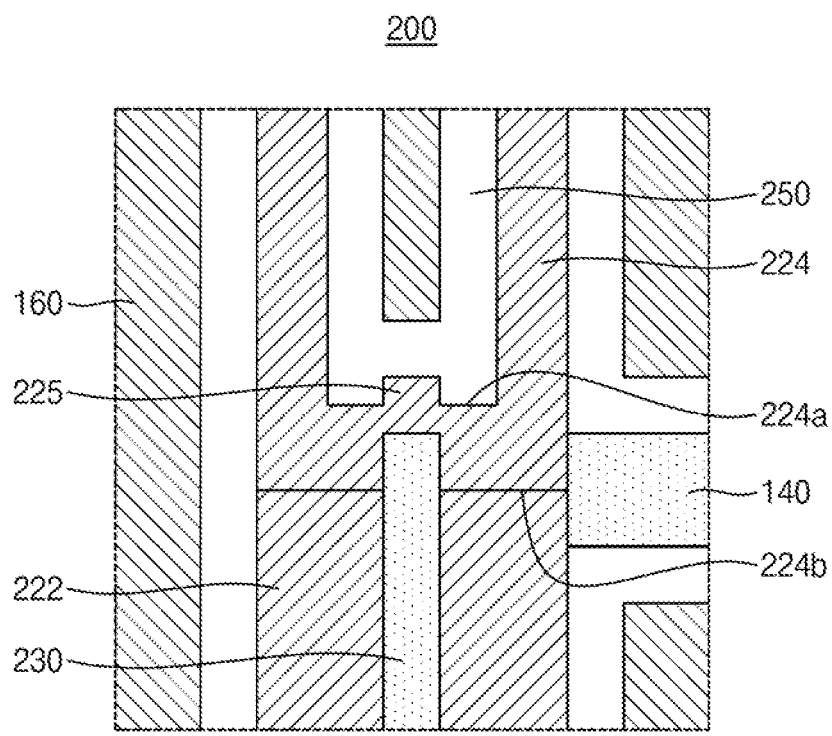
FIGS. 11, 12, 13 and 14 are enlarged partial views of semiconductor devices according to an exemplary embodiment of the present inventive concept.

Referring to FIG. 11, a semiconductor device 200 may include a first lower electrode 222, a second lower electrode 224, an insulating core 230, and a capacitor dielectric layer 250. As shown in FIG. 7, an upper surface of the first lower electrode 222 and an upper end of the insulating core 130 may be positioned at the same level in an etch-back process of the first conductive layer 121 and the insulating core 131. However, in an exemplary embodiment of the present inventive concept, the upper surface of the first lower electrode 222 may be positioned at a lower level than the upper end of the insulating core 230 during the etch-hack process, as shown in FIG. 11. An upper surface of the first supporter pattern 140 is shown as being positioned at a higher level than the upper surface of the first lower electrode 222, but the present inventive concept is not limited thereto. After the etch-back process, the second lower electrode 224 may be conformally formed on the first lower electrode 222 and the insulating core 230.

The second lower electrode 224 having a cylindrical shape may include a protrusion 225 protruding upward from an inner lower surface 224a thereof. Correspondingly, an outer lower surface 224b of the second lower electrode 224 may have a concave shape in an upward direction. The protrusion 225 may overlap the insulating core 230. For example, the protrusion 225 may be positioned on the insulating core 230. As shown in FIG. 10, the capacitor dielectric layer 250 may be conformally formed along surfaces of the etch stop film 110, the first lower electrode 222, the second lower electrode 224, the first supporter pattern 140, and the second supporter pattern 142. A portion of the capacitor dielectric layer 250, which is disposed in the second lower electrode 224, may be formed to have a concave shape in an upward.

Figure 12:
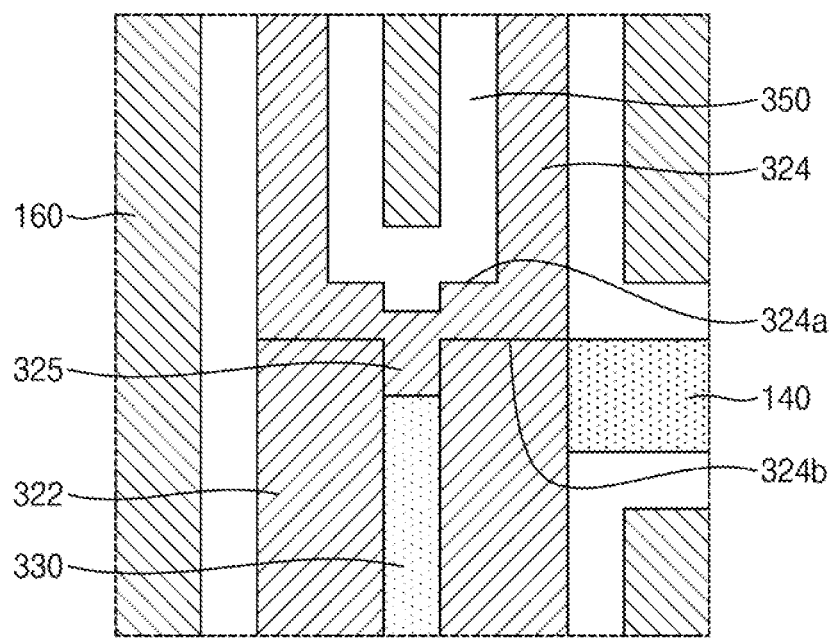

Referring to FIG. 12, a semiconductor device 300 may include a first lower electrode 322, a second lower electrode 324, an insulating core 330, and a capacitor dielectric layer 350. In an exemplary embodiment of the present inventive concept, an upper surface of the first lower electrode 322 may be positioned at a higher level than an upper end of the insulating core 330 during an etch-back process. An upper surface of the first supporter pattern 140 is shown as being positioned at a higher level than the upper end of the insulating core 330, but the present inventive concept is not limited thereto, After the etch-back process, the second lower electrode 324 may be conformally formed on the first lower electrode 322 and the insulating core 330.

The second lower electrode 324 may include a protrusion 325 protruding downward from an outer lower surface 324b thereof. Correspondingly, an inner lower surface 324a of the second lower electrode 324 may have a concave shape extending downward. The protrusion 325 may be positioned on the insulating core 330. The capacitor dielectric layer 350 may be conformally formed along surfaces of the etch stop film 110, the first lower electrode 322, the second lower electrode 324, the first supporter pattern 140, and the second supporter pattern 142. A portion of the capacitor dielectric layer 350, which is disposed in the second lower electrode 324, may be formed to have a convex shape in a downward direction. For example, the capacitor dielectric layer 350 may have a protrusion corresponding to the protrusion 325 of the outer lower surface 324b.

Figure 13:
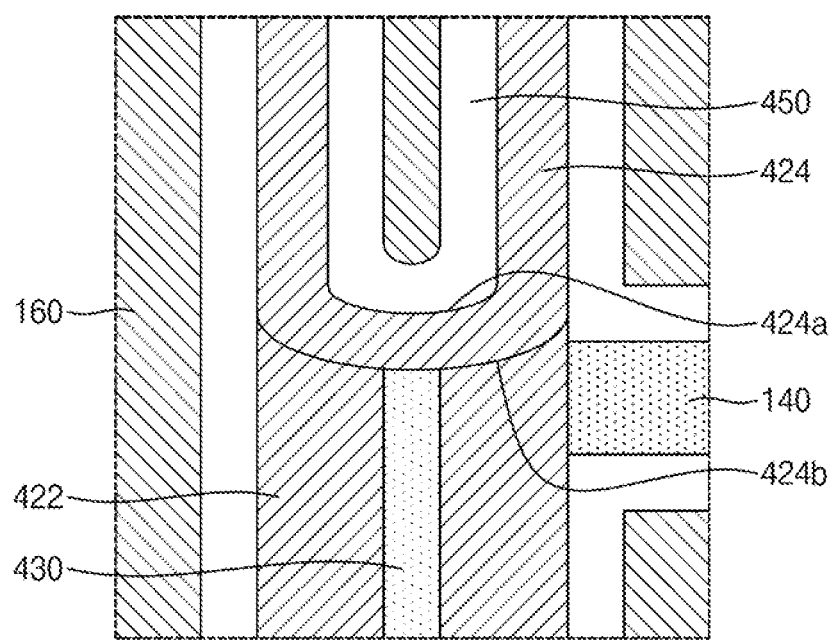

Referring to FIG. 13, a semiconductor device 400 may include a first lower electrode 422, a second lower electrode 424, an insulating core 430, and a capacitor dielectric layer 450. The first lower electrode 422 and the insulating core 430 may be etched to have a convex shape extending (or, e.g., protruding) downward during an etch-back process. For example, an upper surface of the first lower electrode 422 and an upper surface of the insulating core 430 may have a convex shape extending downward. After the etch-hack process, the second lower electrode 424 may be conformity formed on the first lower electrode 422 and the insulating core 430. An inner lower surface 424a and an outer lower surface 424b of the second lower electrode 424 may be formed to have a convex shape extending downward. Further, the capacitor dielectric layer 450 disposed on the inner lower surface 424a of the second lower electrode 424 may include a convex portion extending downward.

Figure 14:
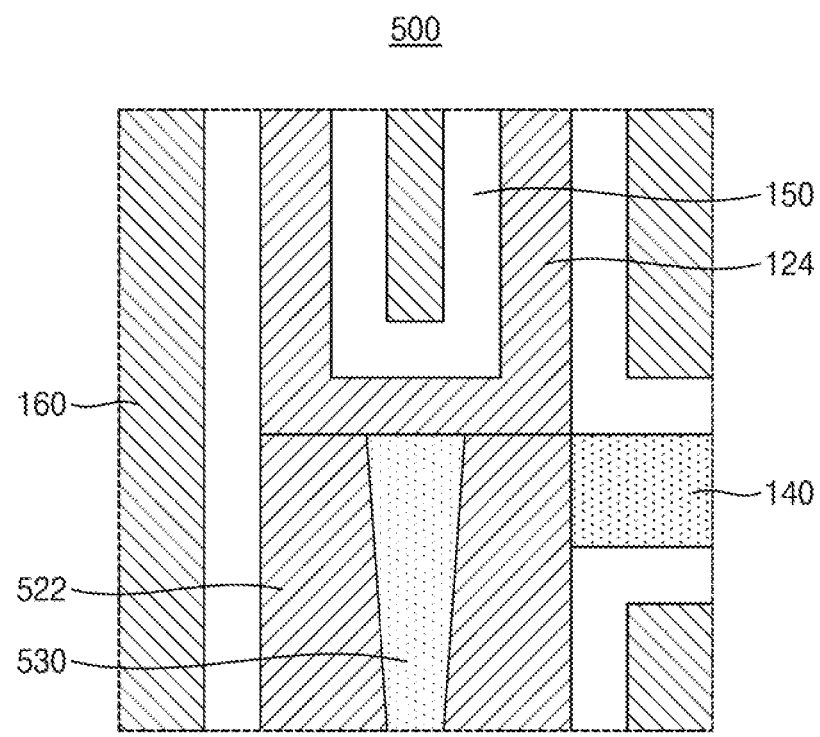

Referring to FIG. 14, a semiconductor device 500 may include a first lower electrode 522 and an insulating core 530, A thickness of the first lower electrode 522 may decrease in a downward direction thereof and a width of the insulating core 530 may decrease in the downward direction thereof. When the first conductive layer 121 is un-conformally deposited, a width of a seam S might not be uniform. For example, the width of the seam S may be formed to be narrow at an upper and/or lower end, or may decrease in a downward direction thereof. The insulating core 530 which fills an inside of the seam S may vary according to a shape of the seam S. In an etching process in which an opening OP1 is formed to pass through the first mold layer 125 and the second mold layer 126, a width of the opening OP1 may decrease in a downward direction thereof, A diameter of an outer circumferential surface of the first lower electrode 522 which fills the opening OP1 may decrease in a downward direction thereof.

FIGS. 15, 16, 17, 18, 19 and 20 are cross-sectional views illustrating a method of manufacturing a semiconductor device according to an exemplary embodiment of the present inventive concept.

Figure 15:
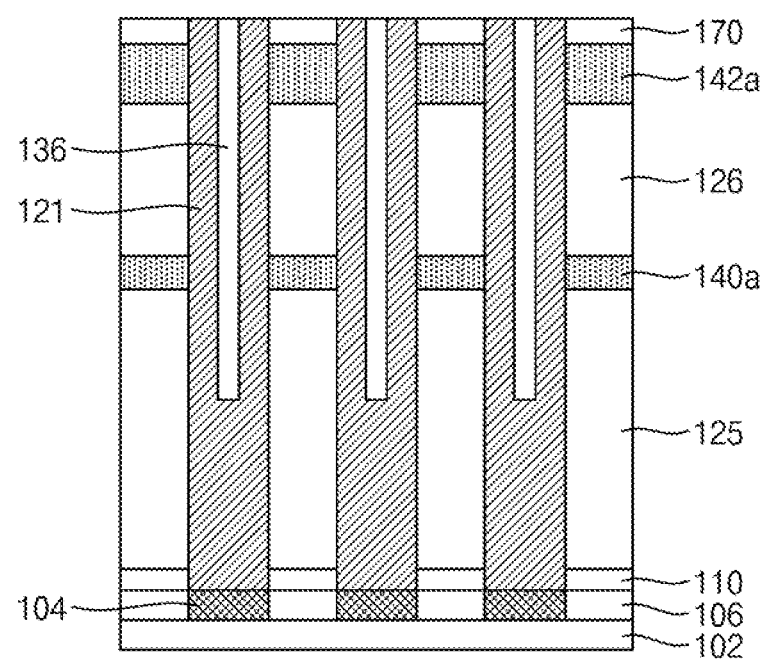
FIGS. 15, 16, 17, 18, 19 and 20 are cross-sectional views illustrating a method of manufacturing a semiconductor device according to an exemplary embodiment of the present inventive concept.

Referring to FIGS. 6 and 15, a sacrificial layer 136 may fill a seam S inside a first conductive layer 121. The sacrificial layer 136 may include an insulating material such as silicon oxide, ACL, and/or the like. The sacrificial layer 136 may be formed by a process such as a CVD process, an ALD process, or the like. After the sacrificial layer 136 fills the seam S, a planarization process may be performed. A second mask pattern 172 may be removed by the above process.

Figure 16:
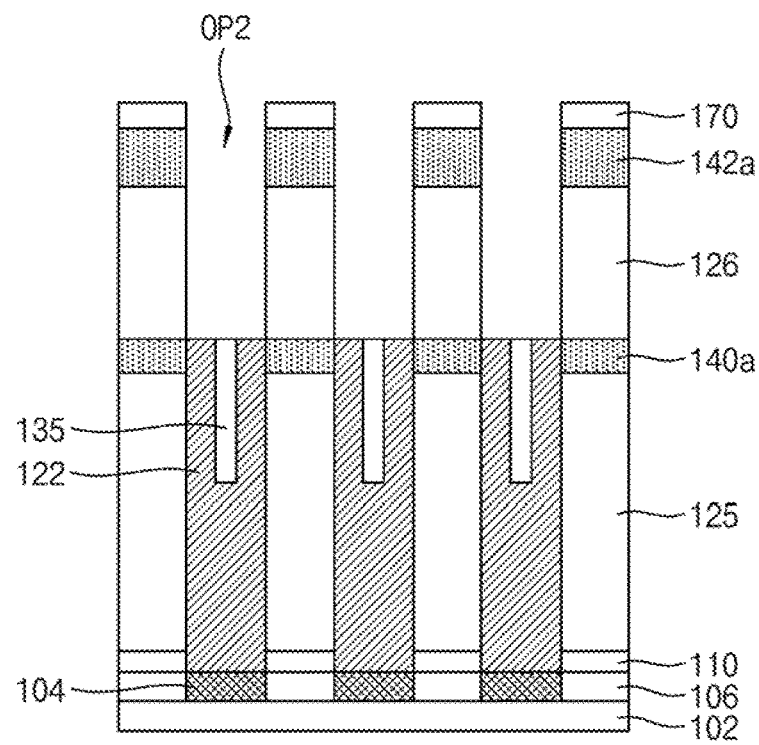

Referring to FIGS. 7 and 16, the first conductive layer 121 may be partially removed by a recess process so that a first lower electrode 122 may be formed. The sacrificial layer 136 may also be partially removed so that an opening OP2 may be formed. Since the sacrificial layer 135 is disposed inside the seam S, a portion of the first conductive layer 121 may be etched during an etching process of the first conductive layer 121 to prevent a contact plug 104 from being exposed. For example, the first conductive layer 121 may etched until the first supporter layer 140a is reached.

Figure 17:
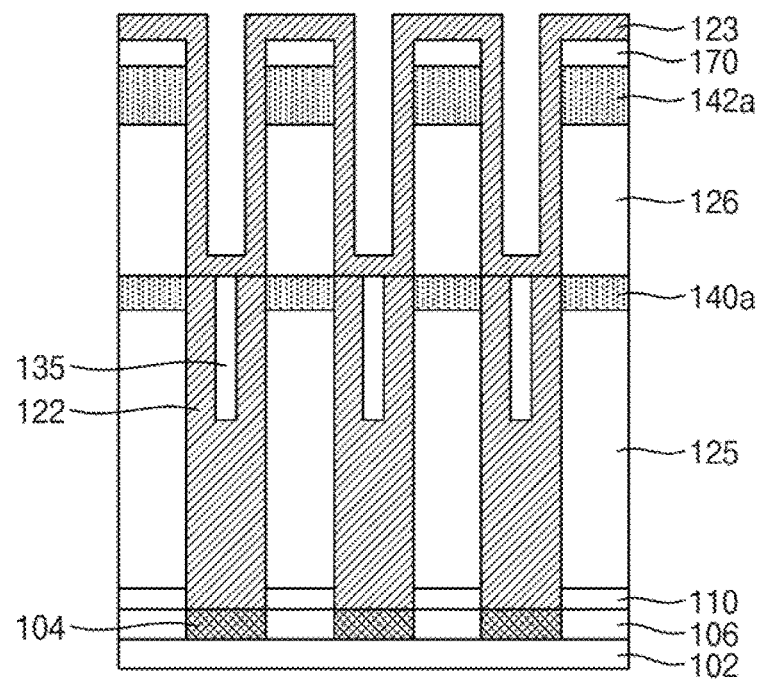

Referring to FIGS. 8 and 17, a second conductive layer 123 may be deposited in the opening OP2 by a process such as CVD, ALD, or the like. The second conductive layer 123 may have a relatively smaller thickness than that of the first lower electrode 122 and/or the first conductive layer 121. The second conductive layer 123 may include the same material as that of the first lower electrode 122.

Figure 18:
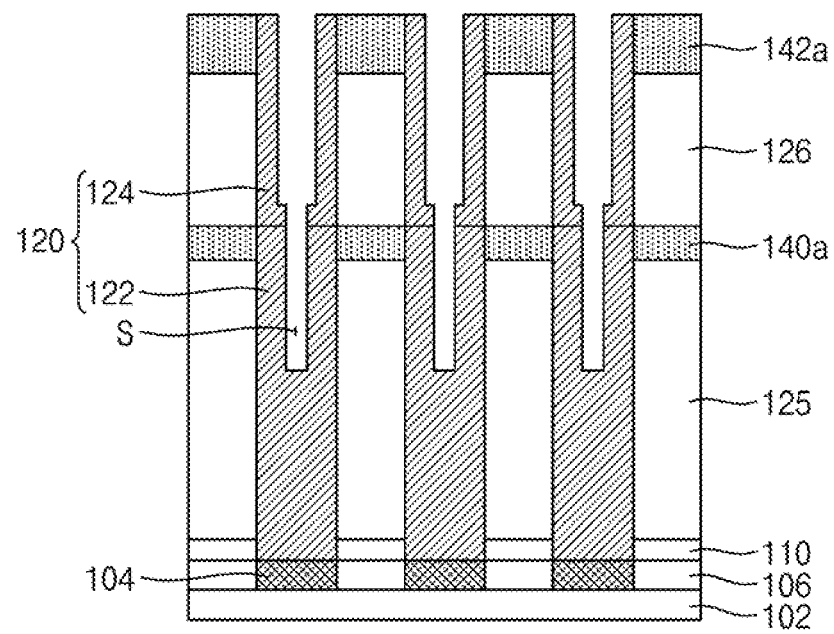

Referring to FIG. 18, a portion of the second conductive layer 123 and the sacrificial layer 135 may be removed. A portion of the second conductive layer 123, which is in contact with the first lower electrode 122, may be partially removed by an etching process to expose the sacrificial layer 135. A planarization process may be performed before the etching process and a first mask pattern 170 may be removed. The exposed sacrificial layer 135 may be removed by a wet etching process. For example, the exposed sacrificial layer 135 may be entirely removed. The first lower electrode 122, a second lower electrode 124, and a second supporter pattern 142, which have an etch selectivity with respect to the sacrificial layer 135, might not be removed. In FIG. 18, the second lower electrode 124 is shown as having a shape having a step formed therein, but the present inventive concept is not limited thereto. In an exemplary embodiment of the present inventive concept, the second lower electrode 124 may have an opening with a constant inner diameter, and the opening at a lower surface of the second lower electrode 124 may have an inner diameter that may be different from an inner diameter of an opening of the first lower electrode 122 at an upper surface of the first lower electrode 122.

Figure 19:
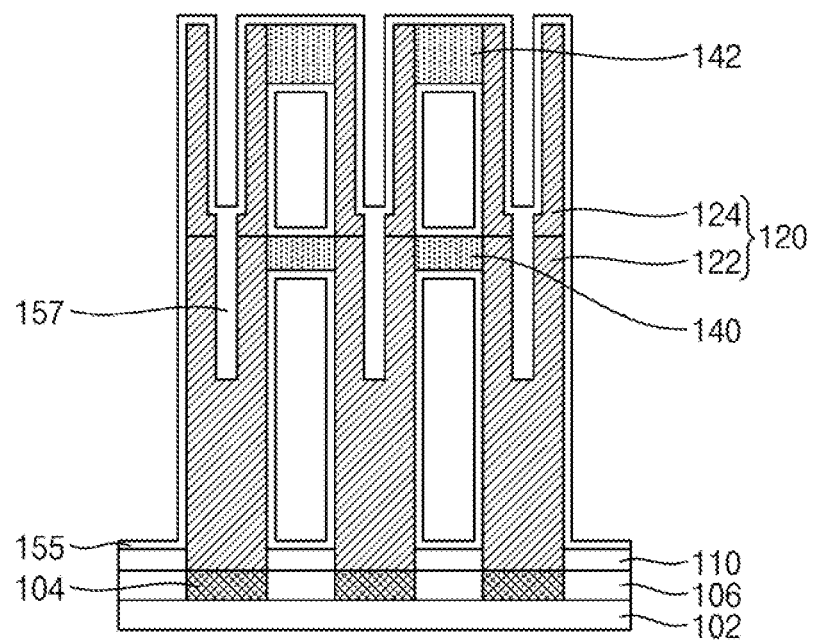

Referring to FIGS. 9, 10, and 19, through-holes patterned in a second supporter layer 142a may be formed. A second mold layer 126, a first supporter layer 140a, and a first mold layer 125 may be anisotropically etched along the through-hole patterns. Thereafter, the first mold layer 125 and the second mold layer 126 may be entirely removed by a wet etching process, and the first lower electrode 122, the second lower electrode 124, the first supporter pattern 140, and the second supporter pattern 142, which have an etch selectivity with respect the first mold layer 125 and the second mold layer 126, might not be removed. A capacitor dielectric layer 155 may be conformally formed along surfaces of the etch stop film 110, the first lower electrode 122, the second lower electrode 124, the first supporter pattern 140, and the second supporter pattern 142. The capacitor dielectric layer 155 may, include an embedded portion 157. The embedded portion 157 may vertically pass through the second lower electrode 124 from an inner lower surface of the second lower electrode 124 to extend to an inside of the first lower electrode 122. The embedded portion 157 may at least partially fill the seam S of the first lower electrode 122. The embedded portion 157 might not function as a capacitor, but may be formed inside the first lower electrode 122 so that leakage current of capacitors may be prevented.

Figure 20:
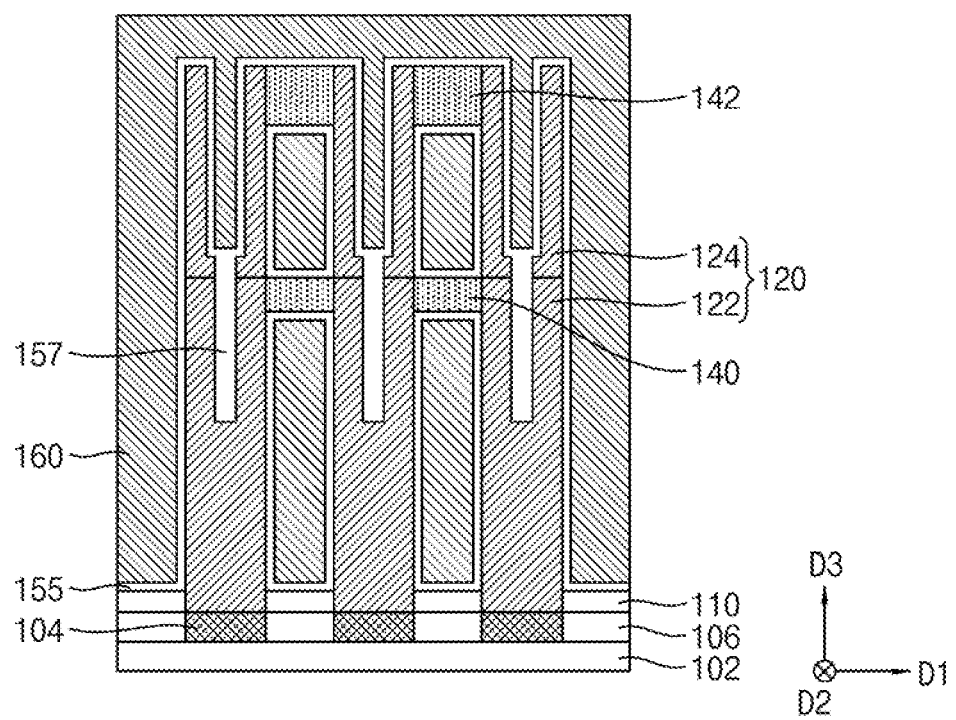

Referring to FIGS. 2 and 20, an upper electrode 160 may be disposed on the resultant of FIG. 19. For example, the upper electrode 160 may be formed to cover the capacitor dielectric layer 155. The upper electrode 160 may at least partially till a space between the lower electrode structures 120, the inside of the second lower electrode 124, and a space between the first supporter pattern 140 and the second supporter pattern 142.

According to an exemplary embodiment of the present inventive concept, in a semiconductor device, an insulating core is formed inside a first lower electrode disposed below a second lower electrode, and thus, exposure of a contact plug can be prevented during an etching process and leakage current and degradation of capacitors can be prevented.

Exemplary embodiments of the present inventive concept are directed to a semiconductor device for preventing leakage current and degradation of capacitors.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A semiconductor device comprising:
   a plurality of lower electrode structures disposed on a substrate;
   a capacitor dielectric layer disposed on a surface of each of the plurality of lower electrode structures; and
   an upper electrode disposed on the capacitor dielectric layer,
   wherein the plurality of lower electrode structures comprises a first lower electrode and a second lower electrode disposed on the first lower electrode and having a cylindrical shape, wherein the first lower electrode has a pillar shape,
   wherein the first lower electrode comprises an insulating core disposed therein,
   wherein a lower surface of the insulating core is positioned closer to an upper surface of the first lower electrode than to a lower surface of the first lower electrode.

2. The semiconductor device of claim 1, wherein the insulating core comprises amorphous silicon, an amorphous carbon layer (ACL), and/or silicon oxide.

3. The semiconductor device of claim 1, wherein the insulating core is sealed by the first lower electrode and the second lower electrode.

4. The semiconductor device of claim 1, wherein a lower end of the insulating core is positioned at a higher level than a lower surface of the first lower electrode.

5. The semiconductor device of claim 1, wherein a diameter of a surface of the second lower electrode is about 50 nm or less.

6. The semiconductor device of claim 1, wherein the second lower electrode further comprises a protrusion protruding upward from an inner lower surface of the second lower electrode,
   wherein the protrusion is disposed on the insulating core.

7. The semiconductor device of claim 1, wherein an upper end of the insulating core includes a concave shape protruding downward.

8. The semiconductor device of claim 1, wherein a width of the insulating core decreases in a direction from an upper end to a lower end.

9. A semiconductor device comprising:

a plurality of lower electrode structures disposed on a substrate;

a supporter pattern disposed between the plurality of lower electrode structures and having a through-hole, the through-hole disposed among three adjacent lower electrode structures;

a capacitor dielectric layer disposed on a surface of each of the plurality of lower electrode structures and the supporter pattern; and an upper electrode disposed on the capacitor dielectric layer, wherein the plurality of lower electrode structures comprises a first lower electrode and a second lower electrode disposed on the first lower electrode and having a cylindrical shape, wherein the first lower electrode has a pillar shape, wherein the first lower electrode comprises an insulating core disposed therein, wherein the through-hole is partially overlap with the three adjacent lower electrode structures in a top view, wherein a lower surface of the insulating core is positioned closer to an upper surface of the first lower electrode than to a lower surface of the first lower electrode.

10. The semiconductor device of claim 9, wherein:

an outer side surface of the first lower electrode and an outer side surface of the second lower electrode are coplanar.

11. The semiconductor device of claim 9, wherein the insulating core comprises amorphous silicon, an amorphous carbon layer (ACL), and/or silicon oxide.

12. The semiconductor device of claim 9, wherein a lower end of the insulating core is positioned at a higher level than a lower surface of the first lower electrode.

13. The semiconductor device of claim 9, wherein a diameter of a surface of the second lower electrode is about 50 nm or less.

14. The semiconductor device of claim 9, wherein an upper end of the insulating core includes a concave shape protruding downward.

15. The semiconductor device of claim 9, wherein a width of the insulating core decreases in a direction from an upper end to a lower end.

* * * * *